United States Patent [19]

Cotues et al.

[11] Patent Number: 5,239,447
[45] Date of Patent: Aug. 24, 1993

[54] STEPPED ELECTRONIC DEVICE PACKAGE

[75] Inventors: Paul W. Cotues; Paul A. Moskowitz, both of Yorktown Heights, N.Y.; Philip Murphy, New Fairfield; Mark B. Ritter, Brookfield, both of Conn.; George F. Walker, New York, N.Y.

[73] Assignee: International Business Machines Corporation, Armonk, N.Y.

[21] Appl. No.: 760,038

[22] Filed: Sep. 13, 1991

[51] Int. Cl.$^5$ .......................... H05K 7/00; H01L 23/00
[52] U.S. Cl. .................................. 361/744; 361/729; 257/686; 437/209
[58] Field of Search ................. 29/832, 838, 839, 840; 174/253, 260, 261, 263; 228/179, 180.2; 357/68, 75, 80; 361/393, 396, 386, 400, 403, 404, 405, 406, 412, 413; 439/62, 65, 66, 68, 71, 86, 91, 493

[56] References Cited

U.S. PATENT DOCUMENTS

| | | | |
|---|---|---|---|
| 3,105,869 | 10/1963 | Branch et al. | 361/412 |
| 3,748,479 | 7/1973 | Lehovec | 250/208.1 |
| 3,769,091 | 10/1973 | Leinkram et al. | 361/400 |
| 3,904,933 | 8/1975 | Davis | 361/386 |
| 4,208,698 | 6/1980 | Narasimhan | 361/402 |
| 4,266,282 | 5/1981 | Henle et al. | 365/52 |
| 4,296,456 | 10/1981 | Reid | 361/403 |
| 4,351,706 | 9/1982 | Chappell et al. | 156/655 |
| 4,417,392 | 11/1983 | Ibrahim | 357/69 |
| 4,426,689 | 1/1984 | Henle et al. | 361/398 |
| 4,437,235 | 3/1984 | McIver | 174/260 |
| 4,451,845 | 5/1984 | Philofsky | 357/72 |

(List continued on next page.)

FOREIGN PATENT DOCUMENTS

| | | | |
|---|---|---|---|
| 0314437 | 5/1989 | European Pat. Off. | |
| 55-115339 | 9/1980 | Japan | |
| 57-31166 | 2/1982 | Japan | 257/686 |
| 59-127856 | 7/1984 | Japan | |
| 63-255974 | 10/1988 | Japan | 357/75 |
| 3-148842 | 6/1991 | Japan | 361/398 |
| WO85/02060 | 5/1985 | World Int. Prop. O. | |

OTHER PUBLICATIONS

"Pursuing 3-D Packages" by M. F. Suer, Elec. Eng. Times, pp. 66, Jan. 21, 1991.

(List continued on next page.)

Primary Examiner—Leo P. Picard
Assistant Examiner—D. Sparks
Attorney, Agent, or Firm—Daniel P. Morris

[57] ABSTRACT

An electronic device packaging structure is described wherein an electronic device is electrically connected to a substrate wherein the electronic device subtends a non-normal angle with respect to the substrate. In a more specific embodiment, a plurality of electronic devices are stacked at offset with respect to each other to expose contact locations on the surface of each electronic device at an edge of each electronic device to form a stepped surface exposing a plurality of electronic device contact locations. This surface is disposed against a substrate having a plurality of contact locations thereon. The electronic device contact locations can be electrically interconnected to the substrate contact locations by solder mounds or alternatively by a cylindrical shaped elastomeric body having metallization bands with a spacing corresponding to the electronic device contact locations. The elastomeric body is pressed between the edge of the stacked electronic devices having the contact locations thereon and substrate surface to form electrical interconnections between electronic device contact locations and substrate contact locations through the electrically conducting bands. The stacked electronic devices can be thermally connected to a heat dissipation member. The stacked electronic devices can have a stepped surface embodying an enhanced area for transfer of heat from the electronic device stack to the heat dissipation member.

9 Claims, 5 Drawing Sheets

U.S. PATENT DOCUMENTS

| | | | |
|---|---|---|---|
| 4,500,905 | 2/1985 | Shibata | 357/68 |
| 4,525,921 | 7/1985 | Carson et al. | 357/75 |
| 4,528,530 | 7/1985 | Ketchen | 361/413 |
| 4,617,160 | 10/1986 | Belanger et al. | 156/64 |
| 4,646,128 | 2/1987 | Carson et al. | 357/74 |
| 4,706,166 | 11/1987 | Go | 357/75 |
| 4,764,846 | 8/1988 | Go | 361/386 |
| 4,897,708 | 1/1990 | Clements | 357/65 |
| 4,956,746 | 9/1990 | Gates, Jr. et al. | 361/396 |
| 4,959,749 | 9/1990 | Dzarnoski, Jr. et al. | 361/396 |
| 4,984,064 | 1/1991 | Teshio et al. | 357/80 |
| 4,992,908 | 2/1991 | Solomon | 361/400 |
| 5,019,943 | 5/1991 | Fassbender et al. | 361/396 |
| 5,019,946 | 5/1991 | Eichelberger et al. | 361/396 |
| 5,092,782 | 3/1992 | Beaman | 439/65 |
| 5,103,247 | 4/1992 | Sugano et al. | 361/400 |

OTHER PUBLICATIONS

"3-D Interconnection for Ultra-Dense Multichip Packages", C. Val and T. Lemoine (Thomson CSF), IEEE Trans. CHMFT, 13, Dec. 1990.

J. B. Gillett, "Inexpensive Chip Package", vol. 33, No. 1A, Jun. 1990, IBM Technical Disclosure Bulletin, pp. 272-273.

IBM TDB, vol. 19, Jun. 1976, p. 372, "Fabrication of Multiprobe Miniature Electrical Connector", W. Anacker, E. Bassous et al.

IBM TDB, vol. 18, Mar. 1976, "Solder Bonding of Silicon Chips with Through Holes", L. Kuhn and R. Lane.

IBM TDB, vol. 20, Apr. 1978, "Vertical Chip Packaging", R. Henle.

IBM TDB, vol. 21, Dec. 1978, "Edge-Connected Chip Carrier", A. Johnson, IBM.

IBM TDB, vol. 14(9), 2561 (1972) "Bubble Domain Three-Dimensional Magneto-Optic Memory", H. Chang, IBM.

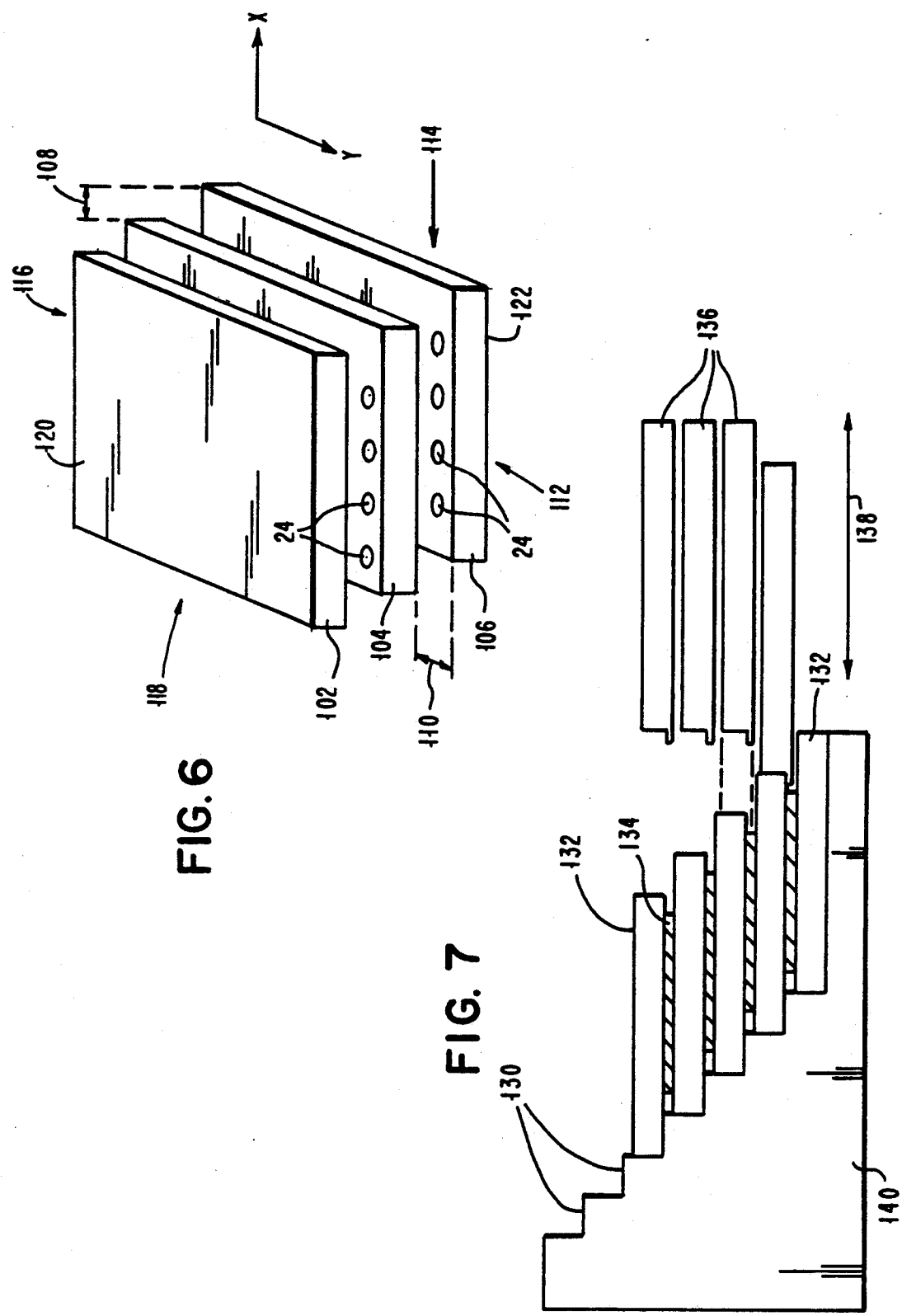

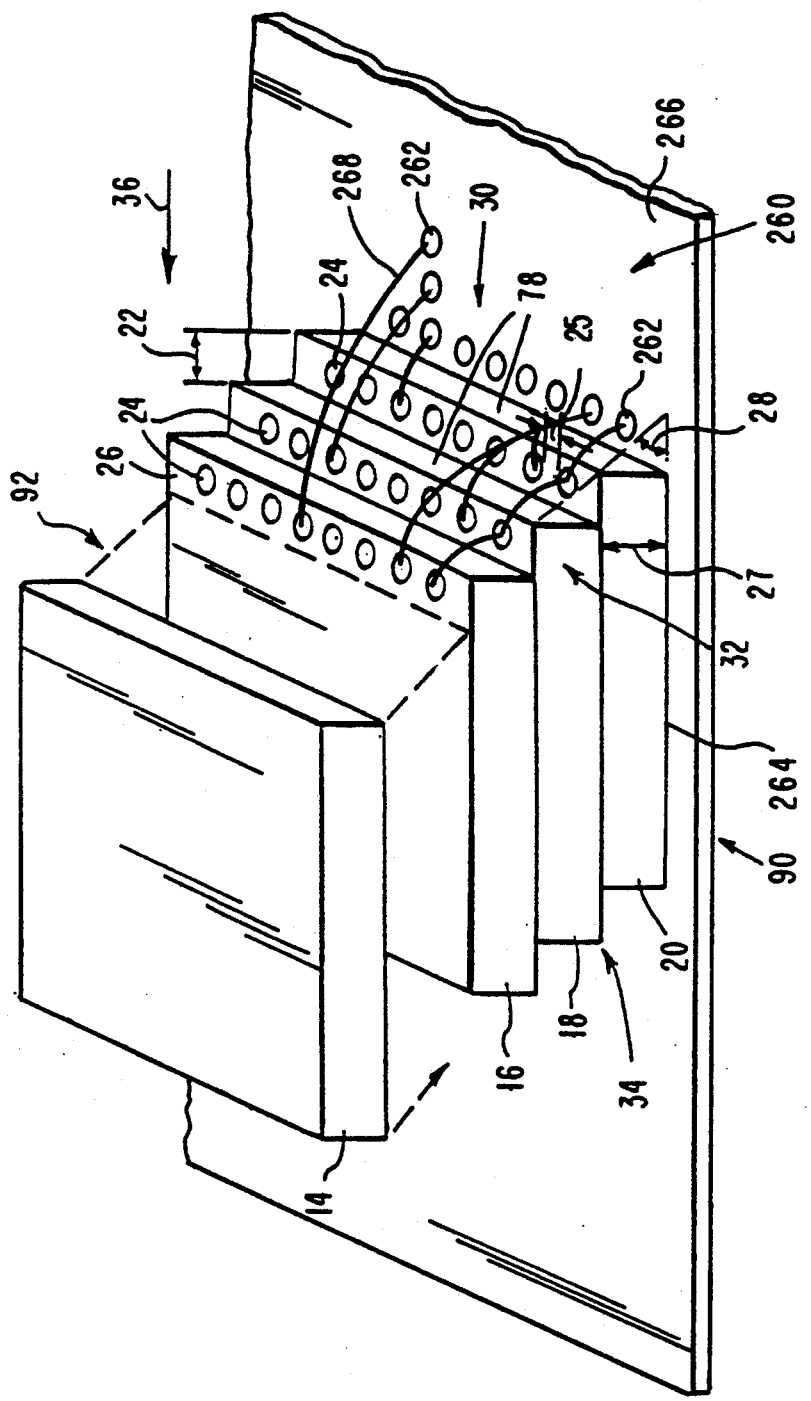

STEPPED ELECTRONIC DEVICE PACKAGE

FIELD OF THE INVENTION

This invention relates to an electronic device packaging structure wherein at least one electronic device, e.g., a semiconductor chip, is electrically connected to a substrate through pads along an edge of the electronic device which are disposed adjacent pads on the substrate and wherein the electronic device projects away from the substrate at a non-right angle. More particularly the present invention is directed to an electronic device packaging substrate having a plurality of electronic devices disposed against one another in a stack so that portions of each electronic device having contact locations in the proximity of an edge thereof extend slightly beyond the boundary of the underlying electronic device to expose the contact locations of the underlying device to form a stepped region and wherein the stepped region of the structure is disposed against an array of contact locations on a substrate for electrical connection thereto.

BACKGROUND OF THE INVENTION

To reduce the cost and increase the performance of electronic computers, it is desirable to place as many electronic circuits in as small a region as possible in order to reduce the distance over which electrical signals must travel from one circuit to another. This can be achieved by fabricating on a given area of a semiconductor chip as many electronic circuits as feasible with a given fabrication technology. Typically, these dense chips are disposed on the surface of a substrate in a side by side arrangement with space left there between to provide regions for electrical conductors for electrical interconnection of the chips. The chip contact locations can be electrically connected to substrate contact locations by means of wires bonded between the chip contact locations and the substrate contact locations. Alternatively a TAB tape (which is a flexible dielectric layer having a plurality of conductors disposed thereon) can be used for this electrical connection. Alternatively, the semiconductor chips can be mounted in a flip-chip configuration wherein an array of contact locations on the semiconductor chips is aligned with and electrically connected to an array of contact locations on the substrate by means of solder mounds disposed between corresponding chip and substrate contact locations. The side by side arrangement of electronic devices is not the most dense configuration which can be achieved.

The most dense packaging configuration for semiconductor chips, in particular for memory chips, such as DRAMS, SRAMS, Flash Eproms and the like, may be obtained through the construction of a solid cube of semiconductor chips. The difficult problem to solve for such a cube is providing for electrical connections to the chips. The electrical connections must include power supply, data and address lines and the like.

Prior art shows that it is possible to construct dense packages of stacked semiconductor wafers or chips. The major problems are that of interconnecting the chips electrically and that of solving the problem of thermal dissipation. Chips are generally stacked in orthogonal rectangular or cubic structures.

As used herein, an orthogonal rectangular or cubic package refers to a package wherein either square or rectangular chips are stacked directly on top of each other with the edges thereof of adjacent chips aligned.

The electrical connections are handled generally in three manners: (1) Fabricate vias through the semiconductor structures to facilitate interconnections; (2) metallization is carried up to and past the edge of the chips and are also placed on the sides of the stack; (3) chips are bonded on carriers which bring electrical connections past the edges of the chip. The carriers are in turn stacked in orthogonal rectangular or cubic structures.

Generally, the problem of thermal dissipation is either not addressed or is handled by conduction through the structures to the environment.

IBM Technical Disclosure Bulletin, Vol. 14 (9), 2561 (1972) "Bubble Domain 3-Dimensional Magneto-Optic Memory", H. Chang, describes a non-orthogonal stack of chips whose faces are offset so as to allow laser access to one row of pads on each chip. No plan for electrical contact, I/O for power, board mounting or cooling is provided.

U.S. Pat. No. 4,500,905, "Stacked Semiconductor Device with Sloping Sides", describes a non-orthogonal package wherein semiconductor layer fabricated upon one another, are metallized to the edge, and contacts are made on the face of a solid composed of stacked semiconductors. However, the face of the solid is slanted, making the stack into a pyramid rather than a parallelepiped shape. Additional semiconductors are fabricated mounted on the four sides of the pyramidal structure. No cooling means are provided. No means are provided for electrical connection to a board or higher-level package.

It is an object of the present invention to provide an electronic device structure wherein at least one electronic device has at least one edge with at least one contact location thereon. The edge of the electronic device having the contact location is disposed against a substrate having at least one contact location. The electronic device subtends a non-orthogonal angle with respect to the substrate.

It is another object of the present invention to provide a non-orthogonal electronic device package having a plurality of electronic devices in a stack wherein each electronic device has an edge having at least one contact location. The edges with the contact locations thereon are arranged in a stepped or staircase arrangement.

In another more particular aspect of the present invention, the stepped region of the chip stack is disposed against a substrate having a plurality of contact locations thereon for electrical connection to corresponding contact locations on the stepped surface of the chip stack.

These and other objects, features and advantages of the present invention will be more readily apparent to those of skill in the art from the following specification and the appended drawings.

SUMMARY OF THE INVENTION

In its broadest aspect, a structure of the present invention is an electronic device having at least one contact location thereon wherein the electronic device is disposed against a substrate having at least one contact location, wherein the electronic device subtends a non-orthogonal angle with respect to the substrate and wherein at least one contact location on the electronic device is electrically connected to at least one contact location on the substrate.

In a more particular aspect of the present invention, a plurality of electronic devices are disposed in a stack and wherein each electronic device has an edge having at least one contact location thereon and wherein electronic devices are arranged to expose the contact location on each chip edge by forming a stepped surface along at least one side of the electronic device stack.

In another more particular aspect of the present invention, the electronic device stack is disposed against a substrate having a plurality of contact locations thereon, there being at least one substrate contact location electrically connected to at least one contact location.

Another more particular aspect of the present invention is the electrical interconnection between the chip contact location and the substrate contact location through an electrical conductor bearing elastomeric body which is disposed between the chip contact location and the substrate contact location.

In another more particular aspect of the present invention, the electronic device stack has at least one other stepped surface for thermal connection to a heat dissipation means.

BRIEF DESCRIPTION OF THE DRAWINGS

FIG. 6 shows non-orthogonal stacking of chips along two mutually perpendicular directions.

FIG. 7 diagrammatically shows an apparatus and method for fabricating the stacked structure described herein.

FIG. 9 shows another embodiment of the stepped structure of the present invention with contact location thereon electrically connected to substrate contact location by wire bonds.

DETAILED DESCRIPTION OF THE PREFERRED EMBODIMENT

Figure 1:
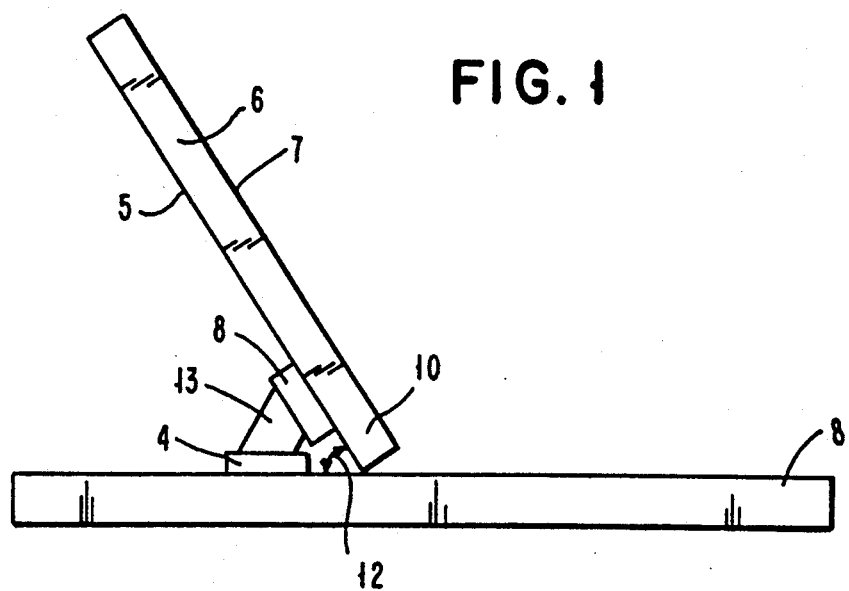
FIG. 1 is a schematic representation of one chip having contact locations thereon along an edge electrically connected to a substrate having contact locations thereon wherein the chip subtends a non-orthogonal angle with respect to the substrate.

FIG. 1 is a side view of an embodiment of the present invention. Substrate 2 has at least one contact location 4 thereon. Electronic device 6 has at least one contact location 8 on major surface 5 along an edge 10. Electronic device 6 has an opposite surface 7. Electronic device 6 subtends an angle 12 with respect to substrate 2. Angle 12 is a non-orthogonal angle, that is not 90 degrees. Electronic device 6 contact location 8 is electrically connected to substrate contact location 4 by electrical interconnection means 13 which can be metallized elastomeric body as described herein below, and which can also be a solder interconnection; wireboard array, patterned conductive epoxy; liquid metal; spring loaded or spring contacts; e.g., fuzz buttons or any other electrical interconnection means.

Figure 2:
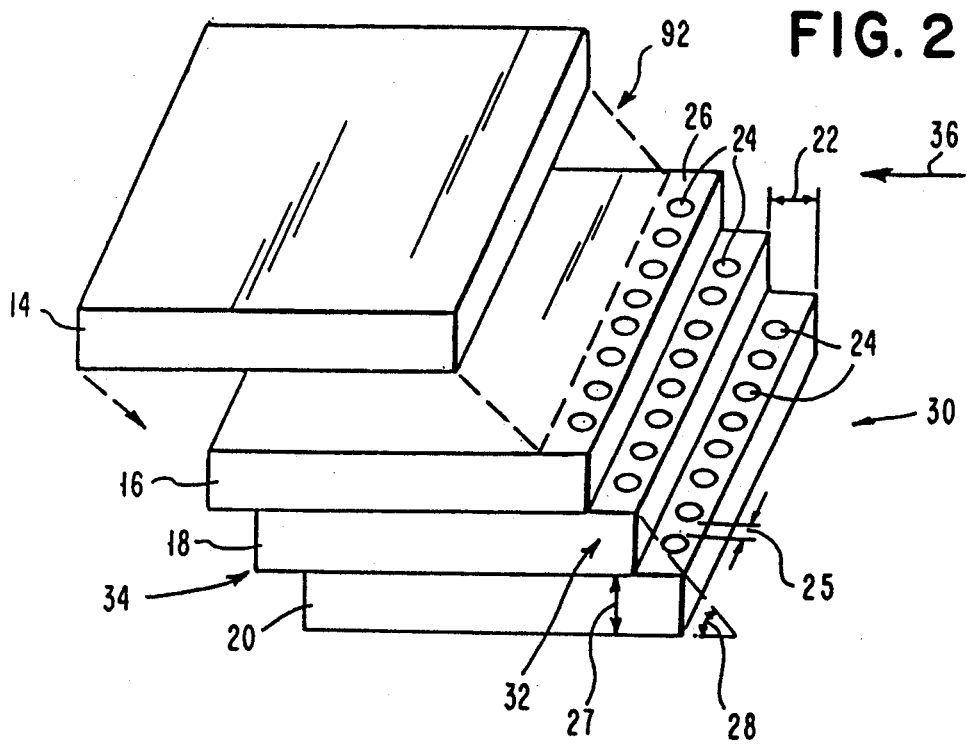
FIG. 2 shows a plurality of chips stacked in a non-orthogonal arrangement.

FIG. 2 shows a plurality of electronic devices 14, 16, 18 and 20, which are stacked one on top of each other. Electronic devices 16, 18 and 20 are disposed in intimate contact with respect to each other. Electronic device 14 is shown spaced away from electronic device 16 for the purpose of showing how the electronic devices are stacked. FIG. 2 shows four electronic devices in a stack. The structure of FIG. 2 is not limited to four, there can be any number of electronic devices in a stack. Each electronic device can be any type of an electronic device such as a dielectric material having electrically conducting lines therein, for example a printed circuit board and a metallized ceramic. Alternatively, electronic devices of FIG. 2 can be semiconductor chips, for example, silicon chips and gallium arsenide chips. Each electronic device is stacked onto an adjacent device with an edge of each device set back by a distance 22 from the adjacent device. The setback is preferably the same between each device. Each device has at least one contact location 24, preferably a plurality of contact locations along an edge region 26. The setback 22 results in the contact locations 24 being exposed for each device. In the preferred embodiment, the top device in the stack 14 is preferably a dummy device, that is having no electrical function but having a structural function but this is not necessary. If the setback 22 of each device is equal, the structure has a stack angle 28. The resultant stacked chip structure 30 has a stepped or staircased edge 32 with exposed electronic device contact locations and if the electronic devices are of the same dimension, there is a corresponding stepped or staircased surface 34 which can have additional chip contact locations or can be without device contact locations. The structure of FIG. 2 shows each electronic device stepped back from an adjacent electronic device along the same direction 36. Between each adjacent electronic device such as 16 and 18 there is preferably an adhesive, such as an epoxy cement to keep each electronic device of the stack 30 physically adhering together. An adhesive layer is not shown in FIG. 2. Alternatively, the electronic devices of the stack 30 can be mechanically held together by a clamp. There may also be spacers placed between the devices.

Figure 4:
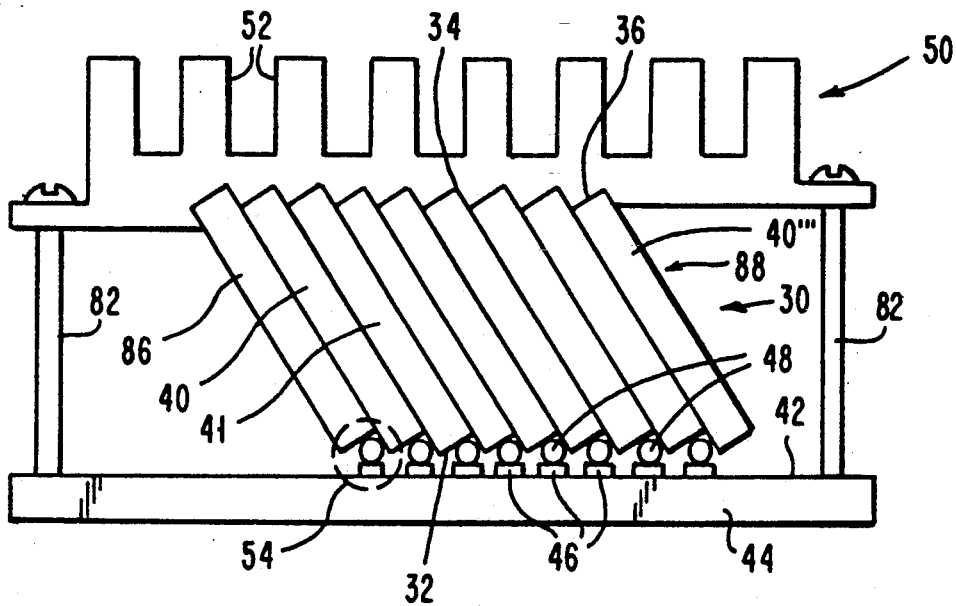
FIG. 4 shows the chip stack of FIG. 2 with the structure of FIG. 3 as the electrical interconnection means and a heat sink disposed in connection with the chip stack.

FIG. 4 shows an electronic device stack 30 having nine electronic devices 40 in the stack. Electronic device stack 30 edge 32 having the exposed electronic device contact locations is disposed adjacent surface 42 of substrate 44. Surface 42 of substrate 44 has a plurality of contact locations 46 thereon. Contact locations 46 are electrically interconnected to contact locations 24 of electronic devices 40 by means 48 which can be a plurality of solder mounds disposed between electronic device contact locations 24 and a corresponding substrate contact location 46. Where solder mounds are used the controlled-collapse-chip-connection methods described in U.S. Pat. Nos. 3,401,126 and 3,429,640 to Miller, the teachings of which are incorporated herein by reference. Stepped edge 34 of electronic device stack 30 which is opposite to stepped edge 32 is disposed in to a stepped groove 36 in the surface of heat sink 38. The stepped surface 34 of electronic device stack 30 provides an enlarged surface area than would be provided if each electronic device were stacked orthogonally on top of each other, that is with a zero stack angle 28. This stepped surface 34, having an enhanced surface area permits an enlarged surface through which heat can pass through electronic devices 40 into the heat dissipation means 50. The heat dissipation means 50 can be a cast aluminum heat sink having projecting fins 52 or can be folded aluminum sheet heat sink or any other suitable heat sink.

Figure 5:
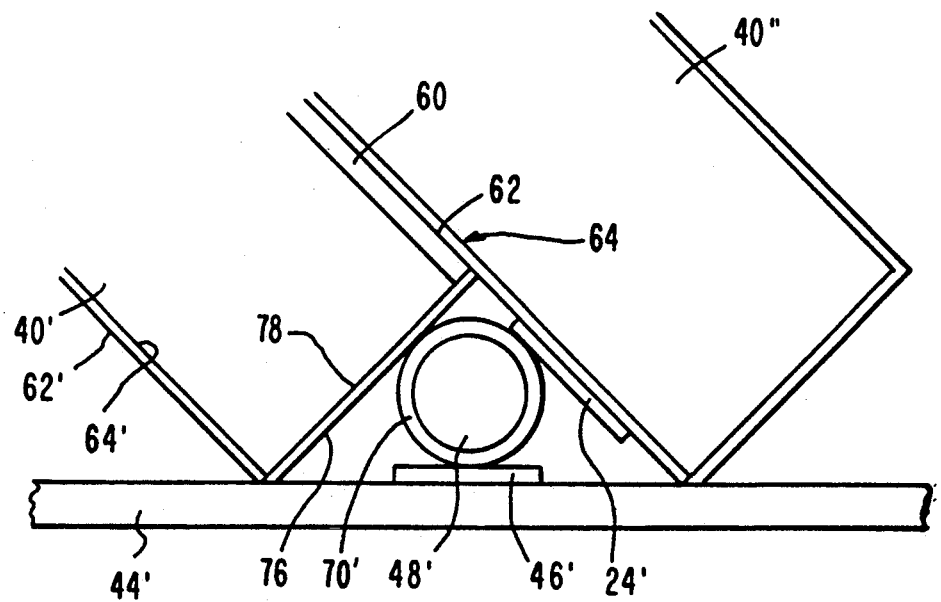
FIG. 5 is an enlarged view of the electrical interconnection means of FIG. 4.

FIG. 5 is an exploded view of region 54 of FIG. 4. Electronic device 40' is disposed against electronic device 40" with an adhesive layer 60 therein between. On the surface of electronic device 40", which is disposed against adhesive layer 60, there is a dielectric layer 62 to provide electrical isolation for conductors at the surface 64 of electronic device 40". Similarly there can be a dielectric layer 62' at surface 64' of electronic device 40'. Since in region 54 of FIG. 4 electronic device 40' is at the end of the stack, electronic device 40' can be a dummy electronic device, that is, not containing any electrical components. Electrical interconnection means 48' electrically interconnects electronic device contact pad 24' to substrate contact pad 46'.

Figure 3:
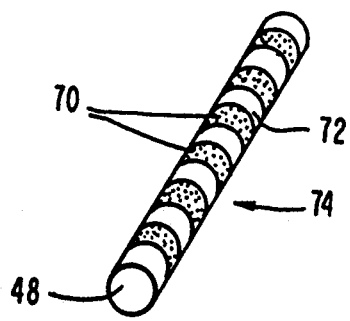
FIG. 3 shows an elongated cylinder having electrically conducting bands thereon which is used as the electrical interconnector between the chip contact locations and the substrate contact locations in the embodiments shown in FIGS. 4 and 5.

FIG. 3 shows the preferred embodiment of electrical interconnection means 48' of FIG. 5. Electrical interconnection means 48 of FIG. 3 is a cylindrically shaped elastomeric body. Suitable elastomeric materials are polymer materials such as silicon-based elastomers. About the circumferential periphery of elastomeric body 48 there are a plurality of metallization patterns 70 which form cylindrical rings or bands on the surface 72 of the elastomeric body 48. The bands of metallization can be gold-plated copper or Ni/Au plated copper, or silver copper or other alloys which do not oxidize easily. The metallization bands spacing is made to correspond to the electronic device contacts pad spacing 25 as shown in FIG. 2. The diameter of the metal on elastomer (MOE) structure 74 of FIG. 3 preferably is about 0.75 of the electronic device thickness 27 as shown in FIG. 2 or setback 22 as shown in FIG. 2.

Referring to FIG. 5, the elastomeric body 48' is pressed towards substrate contact location 46' and toward electronic device contact location 24' and towards surface 76 of electronic device 40'. Means 48' rest in a notch in stepped side 32 of FIG. 4 formed by surface 76 and pad 24' of adjacent electronic devices. Surface 76 is preferably a dielectric layer such as a silicon dioxide layer or other dielectric coating on a silicon electronic device 40' which is disposed on surface 78 of electronic device 40'. The pressure presses metallization band 70 between substrate contact location 46' and electronic contact device location 24' to provide good electrical interconnection between the contact location 24' and 46'. To provide a good pressure connection band 70' and pad 24' it is desirable that 24' have a surface which does not have an oxide thereon. Suitable materials are gold, palladium, platinum, nickel, Ni/Cu, or alloys which do not oxidize easily.

The pressure is provided by pressing the heat sink 50 of FIG. 4 towards substrate 44 by means of bolts 82 or plastic pivots, or spring-loaded columns which physically connect heat sink 50 to substrate 44. Although FIG. 5 shows a heat sink only along the stepped edge 34 of electronic device stack 30, the heat sink 50 can be in physical contact with surface 86 which is the exposed surface of electronic device 40' and with the exposed surface 88 of electronic device 40'''. Also, the heat sink can be in contact with the two non-stepped sides of the chip stack formed by the exposed chip edges. These two sides are shown as 90 and 92 of FIG. 2.

FIG. 6 shows an alternate embodiment for a non-orthogonal substrate stack. FIG. 6 shows substrate 102, 104 and 106. The substrates are offset in both X and Y directions. The two directions of offset do not have to be mutually orthogonal. The X direction setback is 108 and the Y direction setback is 110. The resultant structure has four stepped surfaces 112, 114, 116 and 118. The setback along two directions permits a greater surface area for enhanced dissipation of heat generated by the electrical circuits within the electronic devices. The structure of FIG. 6 shows electronic device contact locations 24 along only one of the stepped edges. The electronic device contact locations can be along more than one of the stepped edges. The structure of FIG. 6 can be mounted to a substrate as shown in FIG. 4, with stepped surface 112 disposed against the surface 42 of substrate 44. The stacked structure of FIG. 6 can be inserted into a cavity in a heat dissipation means wherein the cavity is shaped to receive three remaining stepped surfaces 114, 116 and 118 and the two flat surfaces 120 and 122 for maximum heat dissipation. Surfaces of the electronic device stack of FIG. 6 or FIG. 2 that are in contact with the heat dissipation means can be coated with commonly used thermal greases or thermally conductive polymers in order to enhance heat transfer between the device stack and the heat dissipation means.

Manufacture of the stacked structure 30 of FIG. 4 which allows the assembly of chips into a dense structure in simple and cost-effective manner will now be described. The first problem, in constructing a dense stepped package as described herein is that of assembling the chips into a package with preferably a fixed spacing between the chip surfaces. This problem arises because it is preferred to keep the chip surface to chip surface distance constant so as to be able to connect the array of contacts on the step memory structure to a fixed grid of contacts 46 on substrate 44. While the spacing of contact locations 24 along the edge of the electronic devices 14, 16, 18 and 20 is determined by photolithography and is thus constant, the electronic device thickness may vary. Random variations of contact location position with respect to the electronic device edge about a fixed value, such are incurred as a result of dicing saw location, may be tolerated. Using current technology these can be kept to within plus or minus 25 μm. However, cumulative errors in device thickness may make it impossible to match the array of device contact locations to the array of substrate contact locations.

The solution of the assembly and spacing problem is solved by means of the assembly tool diagrammatically shown in FIG. 7. The tool is configured to have a fixture 140 having steps 130 of a fixed height slightly greater than the maximum chip thickness. Electronic devices 132 are placed, aligned and held in place to each step 136 after the application of an adhesive material 134, e.g. thermally conducting epoxy, to the previous electronic device. Although four electronic devices are shown in FIG. 7, the number may be varied as desired. A back plane, not shown in the diagram, assures alignment of the chip edges in the direction perpendicular to the plane of FIG. 7. The electronic devices 132 are moved into place by movable steps 136 movable back and fourth in direction 138. The sequence of assembly steps diagrammatically shown in FIG. 7 as follows:

Step 1—Load the first electronic device onto the bottom step of the stepped fixture. This locates the first electronic device.

Step 2—Apply a controlled amount of adhesive to the top surface of the first electronic device.

Step 3—Bring the corresponding movable stop 136 into position to align the second electronic device in the fixture 140. The movable stop 136 serves as a support for the other end of the electronic device while loading epoxy and other electronic devices.

Step 4—Load the electronic device chip onto the fixture. Note the electronic device is located on the corresponding step 130 fixture 140 and not the previous electronic device.

Step 5—Go to step two to load the next electronic device.

Figure 8:
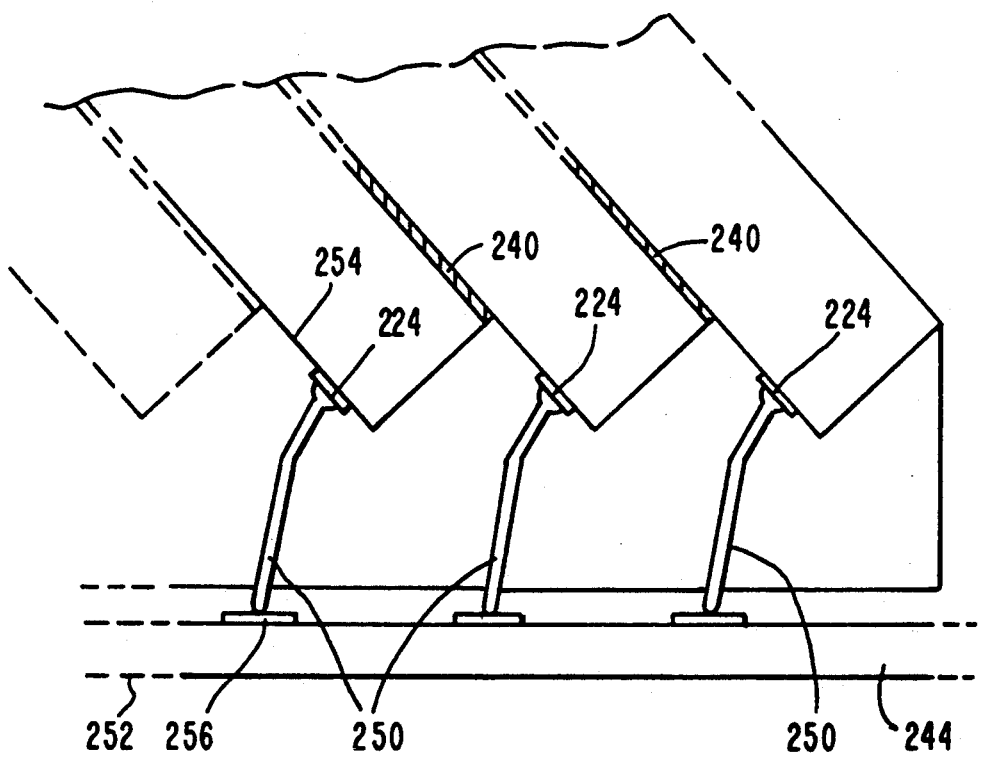
FIG. 8 shows a stacked structure electrically connected to a substrate by an interconnection means formed from formed conductors in an elastomer.

FIG. 8 is a diagrammatical cross section, similar to that of FIG. 5, showing an alternate means for electrically interconnecting the electronic device contact pads 224 in electronic devices 240. Wires 250 are bonded at one end 252 thereof to the electronic device contact pads 224. The wires can be, for example, of Au, Al and Cu, for example of 0.001 to 0.003 inch diameter. The joint between ends 252 and contact locations 224 can be a wire bond. The bonds can be a flattened ball bonds or wedge bonds both of which are commonly practiced in the art. The wires are bent at an angle to the electronic devices surface 254 by jogging the bonder platform that the part rests upon after to bond is made. The end 256 of wire 250 is severed at a predetermined position. The ends 256 may be bent, laser-formed into ball shapes or left as straight wires. End positions may be manipulated to assure a given grid geometry for contact to substrate contact locations 246. The array is then encapsulated in an elastomeric, e.g. silicone, material leaving the ends of the leads free. There are two preferred methods for encapsulation of the leads. The first is to fixture the array so that the balls form a plane at the top of the part, and then to introduce a controlled volume of liquid encapsulant into the area of the leads. The spaces between the leads fills by capillary attraction and stops at the base of the balls. The liquid is then cured at elevated temperature. The second method is to first encase the lead ends in a water soluble solid, i.e., sugar, by dipping into the liquid form and then drying. Liquid elastomer is then forced under pressure into the space to be filled and cured. The water soluble cap is then dissolved away exposing the ends of the leads. The assembly may be pressed to the substrate or solder bonded as described above to the substrate contact locations 246 on substrate 244.

FIG. 9 shows another embodiment of the stepped stack of chips shown in FIG. 2. The stack is disposed on a substrate 260 having a plurality of substrate contact locations 262. Side 264 of electronic device stack 34 is disposed on surface 266 of substrate 260. Substrate 260 can be any suitable electronic device packaging substrate such as a printed circuit board and a metallized ceramic substrate. Wires 268 are bonded between electronic device contact locations 262 in many arrangements. Exemplary arrangements are shown FIG. 9. The wires 268 can be bonded to the electronic devices and substrate contact locations by any bonding means such as by solder thermocompression bonding, ultrasonic bonding and the like. After electrical test and repair it necessary the structure can be encapsulated with a polymer such as silicon or epoxy.

In summary, the present invention is an electronic device having an edge with contact locations thereon which are disposed adjacent to contact locations on a substrate to which they are electrically interconnected and wherein the electronic device subtends a non-normal angle with respect to the substrate. In a preferred embodiment, the structure contains a stack of electronic devices which are stepped along at least one edge on which there are a plurality of electronic device contact locations which are disposed against an array of contact locations on a substrate, there being a means, preferably a cylindrical elastomeric body having metallization bands for electrically interconnecting the electronic device contact locations to corresponding substrate contact locations.

It is to be understood that the above described embodiments are simply illustrative of the principles of the invention. Various other modifications and changes may be devised by those of skill in the art which will embody the principles of the invention and fall within the spirit and scope thereof.

We claim:

1. A structure comprising:
   a substrate having a plurality of substrate contact locations thereon;
   a plurality of semiconducting chips each having a first and second major surface and each having an edge having thereat a plurality of chip contact locations on said first major surface;
   each of said plurality of chips being disposed against each other so that a first major surface of one of said plurality of chips is disposed against the second major surface on an adjacent chips to form a stack of chips;
   each of said chips is disposed to have said edge at the same side of said stack;
   each of said chips is disposed to form a stepped surface to permit said plurality of said chip contact locations to be exposed at said side;
   said stepped surface having a plurality of adjacent triangular notches one side of which contains chips contact locations and the other side of which is an edge of adjacent chip;
   said stepped surface is disposed against said substrate so that said chip contact locations are aligned with said plurality of substrate contact locations;
   an electrical interconnection means for electrically interconnecting said chip contact locations with said plurality of substrate contact locations;
   said electrical interconnection means comprising a plurality of elongated electrical conductive members embedded in an elastomeric material;
   said electrical interconnection means being disposed in said notches, at least one of elongated electrically conductive members being aligned and in contact with at least one of said chip contact locations in said notch; and
   a means for pressing said stack towards said substrate so that at least one of said elongated electrically conductive members is pressed in contact with a chip contact location and a substrate contact location.

2. The structure of claim 1,
   wherein said plurality of electronic devices are disposed against adjacent electronic devices of said plurality to form a stack having at least one stepped side exposing a region of the top surfaces of adjacent electronic devices.

3. The structure of claim 2, further including a heat dissipation means having a stepped surface to engage said at least one stepped side of said stack.

4. The structure of claim 1, further including a means to hold said electronic devices in said stack.

5. The structure of claim 4, wherein said means to hold said electronic devices in said stack is an adhesive disposed between adjacent electronic devices.

6. The structure of claim 4, wherein said means to hold said electronic devices in said stack is a mechanical clamp.

7. The structure of claim 1, further including a heat dissipation means in thermal contact with said stack.

8. The structure of claim 1, wherein said electronic devices are semiconducting chips and wherein said substrate is an electronic packaging substrate.

9. A structure comprising:
a substrate having a plurality of substrate contact locations thereon;
a plurality of semiconducting chips each having a first and second major surface and each having an edge having in the vicinity thereof plurality of chip contact locations on said first major surface;
each of said plurality of chips being disposed adjacent each other so that a first major surface of one of said plurality of chips is disposed adjacent the second major surface of an adjacent chips to form a stack of chips;
each of said chips is disposed to have said edge at the same side of said stack;
each of said chips is disposed to form a stepped surface to permit said plurality of said chip contact locations to be exposed at said side;
said stepped surface having a plurality of adjacent triangular notches one side of which contains chips contact locations and the other side of which is an edge of an adjacent chip;
said stepped surface is disposed against said substrate so that said chip contact locations are aligned with said plurality of substrate contact locations;
an electrical interconnection means for electrically interconnecting said chip contact locations with said plurality of substrate contact locations;
said electrical interconnection means comprising a clestomeric dielectric body having a plurality of bands of electrically conductive material;
said electrical interconnection means being disposed in said notches, at least one of said bands being aligned and in contact with at least one of said chip contact locations in said notch; and
a means for pressing said stack towards said substrate so that at least one of said bands is pressed in contact with a chip contact location and a substrate contact location.

* * * * *